United States Patent
Choi et al.

(10) Patent No.: US 8,982,323 B2
(45) Date of Patent: Mar. 17, 2015

(54) LIGHT GENERATING APPARATUS AND METHOD OF CONTROLLING THE SAME

(75) Inventors: Yoonsun Choi, Inchon (KR); Jinhwan Kim, Suwon-si (KR); Hongseok Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1111 days.

(21) Appl. No.: 12/385,597

(22) Filed: Apr. 14, 2009

(65) Prior Publication Data

US 2010/0060876 A1    Mar. 11, 2010

(30) Foreign Application Priority Data

Sep. 10, 2008  (KR) .................. 10-2008-0089334

(51) Int. Cl.
*G03F 7/20*    (2006.01)

(52) U.S. Cl.
CPC .................................. *G03F 7/70408* (2013.01)
USPC .................... 355/71; 355/46; 355/55; 355/67; 355/77

(58) Field of Classification Search
CPC ........ G03F 7/70091–7/70116; G03F 7/70208; G03F 7/70383–7/70391; G03F 7/70408
USPC .......... 355/25, 46, 53, 55, 67–71, 22, 44, 77; 250/492.1, 492.2, 492.22, 548; 359/238, 227, 2, 9, 10, 31, 35
See application file for complete search history.

(56) References Cited

U.S. PATENT DOCUMENTS

| | | | |
|---|---|---|---|
| 4,496,216 A * | 1/1985 | Cowan ..................... | 359/566 |
| 4,764,889 A * | 8/1988 | Hinton et al. ................. | 708/801 |
| 5,058,992 A | 10/1991 | Takahashi | |
| 5,105,215 A * | 4/1992 | Liu ................................ | 355/40 |
| 5,132,812 A | 7/1992 | Takahashi et al. | |
| 5,142,385 A * | 8/1992 | Anderson et al. ............... | 359/10 |
| 5,159,473 A | 10/1992 | Feldman | |

(Continued)

FOREIGN PATENT DOCUMENTS

| | | |
|---|---|---|
| JP | H08043616 A | 2/1996 |
| JP | 2000-242156 A | 9/2000 |

(Continued)

OTHER PUBLICATIONS

Sainov et al. "Trends in development of dynamic holographic displays." Proceedings of SPIE, vol. 6252 (2006). doi: 10.1117/12.677056.

(Continued)

*Primary Examiner* — Christina Riddle
(74) *Attorney, Agent, or Firm* — Harness, Dickey & Pierce, P.L.C.

(57) ABSTRACT

A light beam generating apparatus and method of controlling the same is provided. The light beam generating apparatus may include a light source, a beam expander collimating a light beam emitted from the light source, an optical shutter selectively transmitting a light beam transmitted through the beam expander, and a focusing lens focusing a light beam transmitted the optical shutter. The optical shutter in the light generating apparatus can selectively transmit a light beam based on on/off control of the optical shutter on a pixel-by-pixel basis. This may permit one-dimensional, two-dimensional and three-dimensional nano patterns having various periods and directions to be manufactured.

13 Claims, 13 Drawing Sheets

(56) References Cited

U.S. PATENT DOCUMENTS

| | | | |
|---|---|---|---|
| 5,262,879 A | 11/1993 | Davis | |
| 5,291,317 A | 3/1994 | Newswanger | |
| 5,298,365 A * | 3/1994 | Okamoto et al. | 430/311 |
| 5,335,044 A * | 8/1994 | Shiraishi | 355/53 |
| 5,369,464 A * | 11/1994 | Kamon | 355/43 |
| 5,759,744 A * | 6/1998 | Brueck et al. | 430/312 |
| 5,986,781 A * | 11/1999 | Long | 359/30 |
| 6,504,644 B1 * | 1/2003 | Sandstrom | 359/291 |
| 6,882,477 B1 * | 4/2005 | Schattenburg et al. | 359/577 |
| 7,599,069 B2 | 10/2009 | Toussaint, Jr. et al. | |
| 2002/0105629 A1 * | 8/2002 | Sandstrom et al. | 355/71 |
| 2003/0030781 A1 * | 2/2003 | Bleeker et al. | 355/67 |
| 2005/0002006 A1 * | 1/2005 | Fukui | 355/53 |
| 2005/0041229 A1 * | 2/2005 | Meisburger | 355/53 |
| 2007/0139633 A1 * | 6/2007 | Bleeker et al. | 355/67 |
| 2008/0204835 A1 * | 8/2008 | Hossfeld | 359/10 |
| 2008/0206685 A1 * | 8/2008 | Shiraishi | 430/322 |

FOREIGN PATENT DOCUMENTS

| | | |
|---|---|---|
| JP | 2002-107691 A | 4/2002 |
| JP | 2002-207202 | 7/2002 |
| JP | 2003-025085 | 1/2003 |
| KR | 10-2007-0103877 | 10/2007 |

OTHER PUBLICATIONS

Tsiganov et al. "The optical system of the stand for DOE-HOE producing with a liquid crystal spatial light modulator." Proceedings of SPIE, vol. 6252 (2006). doi: 10.1117/12.677186.

Korean Office Action dated Jul. 24, 2014 for corresponding Korean Application No. 10-2008-0089334.

* cited by examiner

FIG. 3C
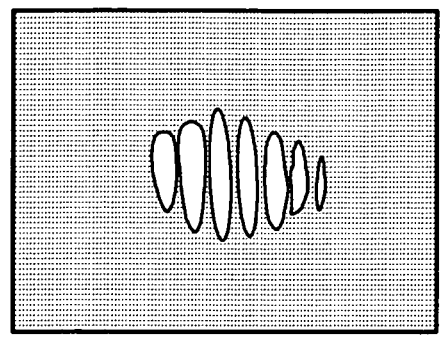
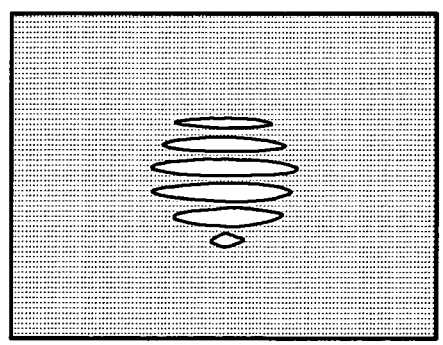

FIG. 3D
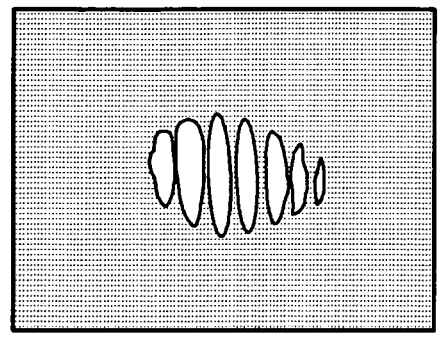
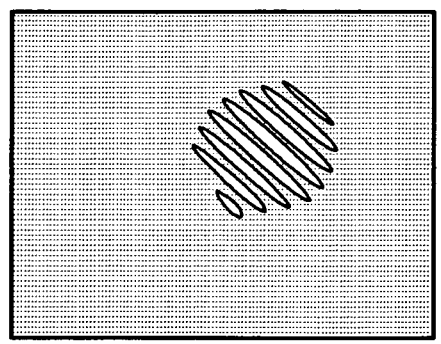

FIG. 3E
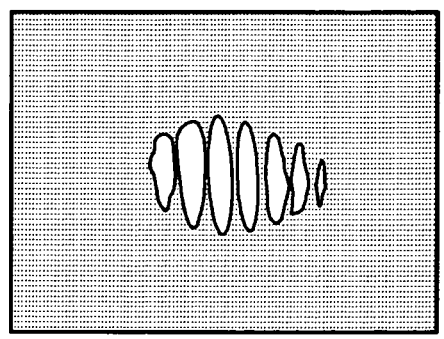
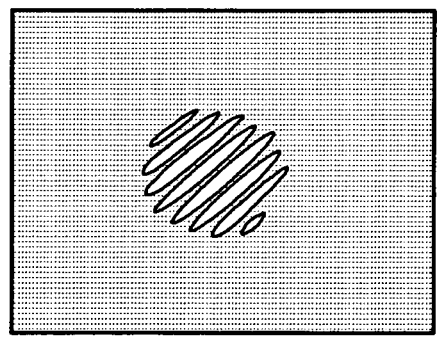

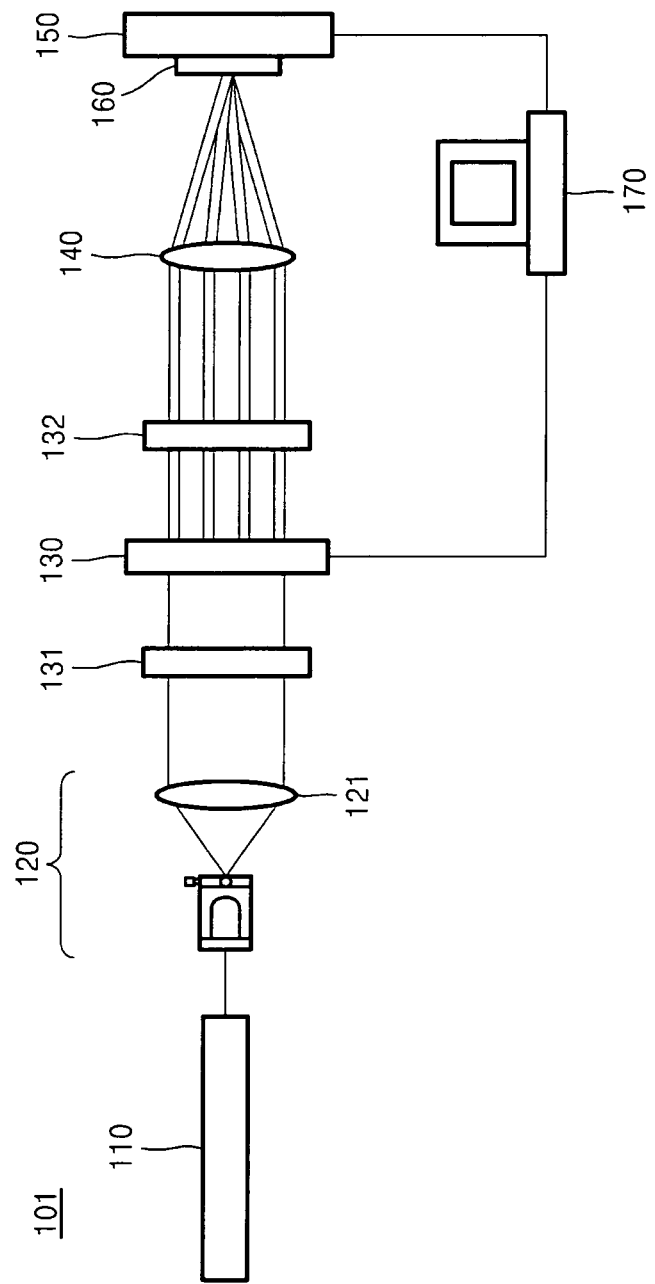

LIGHT GENERATING APPARATUS AND METHOD OF CONTROLLING THE SAME

CROSS-REFERENCE TO RELATED APPLICATION

This U.S. non-provisional patent application claims priority under 35 U.S.C. §119 to Korean Patent Application No. 10-2008-0089334, filed on Sep. 10, 2008, the entire contents of which are incorporated herein by reference.

BACKGROUND

1. Field

Example embodiments relate to light generating apparatuses and methods of controlling the same, for example, a light generating apparatus that manufactures a one-dimensional, two-dimensional, or three-dimensional nano pattern having various periods and/or directions, and a method of controlling the same.

2. Description of the Related Art

A diffracting grating (e.g., a device for diffracting light to a desired direction by using diffraction and/or interference) may be formed by engraving various parallel lines at narrow intervals in a flat glass or a concave metal plate. When light is radiated to a diffracting grating, the transmitted and/or reflected light may cause a light spectrum according to the wavelength of the light.

The diffracting grating may disperse light better than a prism. Also, the diffracting grating's spectrum band may not decrease as it spans toward the red side, which may have a relatively long wavelength. Instead, the diffracting grating's spectrum bands may be uniform from the red regions on through to the violet regions (e.g., all the wavelengths in visible light). Also, the spectrum bands of $1^{st}$, $2^{nd}$ and/or $3^{rd}$ orders may be exhibited in parallel.

Conventionally, laser beam interference emitted from a light source may manufacture a diffraction grating. Such a conventional manufacturing method may control the grating period of a diffraction grating. However, the direction of the grating itself, once made, is geometrically unchangeable. Thus, the direction of the diffraction, which may be caused by chromatic dispersion, may not be controlled.

To address such concerns, a dot matrix system that may freely control grating period and/or direction of a diffraction grating has been proposed. In such a system, a light beam may be transmitted in various directions without chromatic dispersion, which may permit a desired light distribution.

In the dot matrix system, a diffractive optical element (DOE) pattern is used in order to form a diffraction grating pattern. In addition, a motor driver rotating the DOE pattern may change the grating direction of a diffraction grating. However, since the motor driver may operate at a low speed, patterning time may increase. In addition, a method of electrically changing a DOE pattern has also been proposed in order to change the grating direction of a diffraction grating. However, this method may only manufacture a previously calculated pattern.

SUMMARY

Example embodiments provide light generating apparatuses, and methods of controlling of the same, to manufacture a nano pattern having various periods and/or directions.

According to example embodiments, a light generating apparatus may have a light source, a beam expander, an optical shutter, and/or a focusing lens. The light source may emit a light beam. The beam expander may at least one of enlarge and/or collimate the light beam. The optical shutter may selectively transmit a light beam transmitted through the beam expander to form at least two light beams. The focusing lens may focus at least two light beams on a same location such that the at least two light beams interfere with each other.

In further example embodiments, a first portion of the optical shutter may transmit the light beam transmitted through the beam expander, and/or a second portion of optical shutter may not transmit the light beam transmitted through the beam expander. Also, the optical shutter may include a plurality of pixels, such that the optical shutter selectively transmits a light beam according to an on/off control, the on/off control operating on a pixel-by-pixel basis. The on/off control may include at least two optical openings formed in the optical shutter such that the light beam transmitted through the beam expander is selectively transmitted through the openings. Also, the on/off control may adjust at least one of (i) at least one of the at least two openings, (ii) an interval between the at least two openings, (iii) sizes of the at least two openings, (iv) locations of the at least two openings, and/or (v) shapes of the at least two openings. The focusing lens may focus a light beam transmitted through the focusing lens on a photosensitive layer, and/or may form a grating pattern of a diffraction grating using an interference pattern formed on the photosensitive layer by interference of the focused light beam. A period of the diffraction grating may be controlled according to an interval between at least two openings formed in the optical shutter. A direction of the diffraction grating may be controlled according to rotation of at least two openings formed in the optical shutter.

In further example embodiments, the optical shutter may further include a spatial light modulator. The beam expander may further include a collimating lens changing the light beam emitted from the light source into a parallel light beam. The light generating apparatus may further include a plurality of light sources and/or a plurality of optical shutters, the plurality of light sources and/or the plurality of optical shutters may be arranged in an array shape.

In another example embodiment, a light generating apparatus may further include a beam splitter. The beam splitter may have surfaces facing the beam expander, the optical shutter and/or the focusing lens, providing the light beam emitted from the beam expander to the optical shutter, and/or providing the at least two light beams emitted from the optical shutter to the focusing lens. The light generating apparatus may also include a polarizer polarizing the at least two light beams provided by the beam splitter, the polarizer being between the beam splitter and/or the focusing lens. Also, the beam splitter may further include a polarization beam splitter. The optical shutter may further include at least one of a liquid crystal on silicon (LCoS) and a digital micro mirror device (DMD).

In an example embodiment of a diffraction grating, the diffraction grating may include a photosensitive layer and/or a nano pattern formed on the photosensitive layer. The photosensitive layer may receive at least two light beams, an optical shutter at least one of (i) selectively transmits and (ii) selectively reflects the at least two light beams. The nano pattern may be formed by focusing an interference pattern on the photosensitive layer, the interference pattern formed by interference generated by the at least two light beams. Also, an on/off control may control the optical shutter to adjust a period and/or direction of the nano pattern.

In an example embodiment a light generating apparatus control method, a light beam may be emitted from a light source, the light beam may be enlarged and/or collimated, the transmitted collimated light may be selectively reflected and/or selectively transmitted to form at least two light beams, and the two light beams may be focused on a same location such that the two light beams may interfere with each other. The reflecting and/or transmitting may be performed on a pixel-by-pixel basis by an on/off control, the on/off control controlling an optical shudder including a plurality of pixels. The reflecting and/or transmitting may be performed by controlling an optical shutter, on which at least two openings are to be formed, so that only a light beam incident on the openings is transmitted through the optical shutter. In further example embodiments, the interval between the at least two openings may be controlled. Also, the at least two opening on the optical shutter may be rotated. The light beam may be divided by a beam splitter, and the divided beam may be selectively reflected by an optical shutter.

BRIEF DESCRIPTION OF THE DRAWINGS

The accompanying figures provide a further understanding of example embodiments along with the description of the example embodiments. In the figures:

FIGS. 3A through 3E illustrate patterns of diffraction gratings formed by light transmitted through the openings of FIGS. 2A through 2E according to an example embodiment;

FIG. 4 illustrates a light generating apparatus according to an example embodiment;

DETAILED DESCRIPTION

Figure 1:
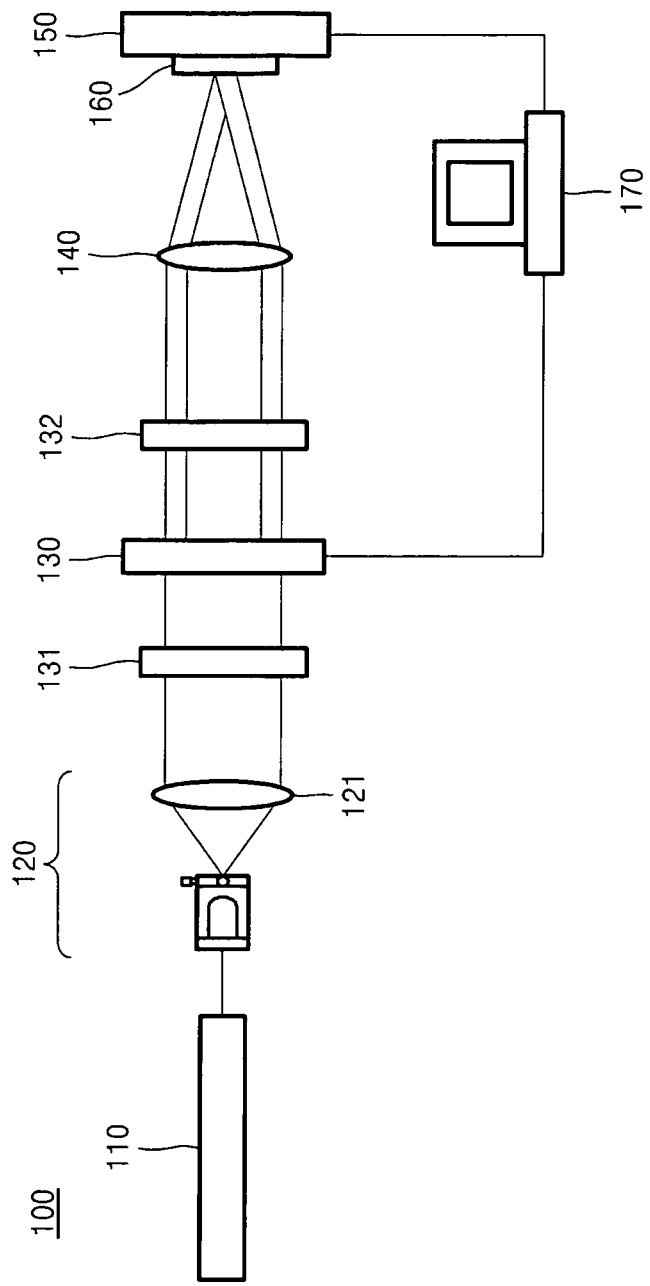
FIG. 1 illustrates a light generating apparatus according to an example embodiment.

Example embodiments may be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a light generating apparatus 100 according to an example embodiment. The light generating apparatus 100 may include a light source 110, a beam expander 120, a first polarizer 131, an optical shutter 130, a second polarizer 132 and/or a focusing lens 140.

The light source 110 may be a laser beam emitting device with improved coherence and/or straight features. The light source 110 may not be limited to a particular device. Examples of light source 110 may include a gas laser (e.g., a helium-neon laser and/or an excimer laser), a solid laser (e.g., a ruby laser and/or a Nd:YAG laser) and/or a semiconductor laser.

A light beam emitted from the light source 110 may be a polarized beam. Alternatively, the light beam emitted from the light source 110 may be a non-polarized beam, polarized by first polarizer 131. The light source 110 is well known to one of ordinary skill in the art, and thus its description is not given here.

The beam expander 120 may collimate the light beam emitted from the light source 110. In particular, the beam expander 120 may enlarge the width of the light beam emitted from the light source 110 and/or may convert the light beam into parallel light so that the parallel light is incident on the optical shutter 130. The beam expander 120 may further include a collimating lens 121 in order to convert the light beam emitted from the light source 110 into light parallel to an optical axis.

The first polarizer 131, the optical shutter 130, and/or the second polarizer 132 may be sequentially disposed on the path of a light beam transmitted through the beam expander 120.

The first and second polarizers 131 and 132 may each be a device for obtaining linearly polarized light, such as a thin plate that only transmits light oscillating in a desired (or, alternatively, a predetermined) direction. According to an example embodiment, the first polarizer 131 and/or the second polarizer 132 may have polarization planes perpendicular to each other. Thus, a polarized light beam transmitted through the first polarizer 131 and a polarized light beam transmitted through the second polarizer 132 may be perpendicular to each other.

The optical shutter 130 may further transmit the light beam transmitted through the beam expander 120. The optical shutter 130 may be a transparent spatial light modulator (T-SLM) including a plurality of pixels and may selectively transmit light according to on/off control on a pixel-by-pixel basis.

The optical shutter 130 may also include a liquid crystal display (LCD) (e.g., a thin film transistor liquid crystal display, TFT-LCD). In such a case, an off-state may refer to a state in which a voltage is not applied to the optical shutter 130. In an off-state, the optical shutter 130 may rotate by 90 degrees the light beam from the first polarizer 131 along a molecule arrangement of liquid crystals in the optical shutter 130. This rotated light beam proceeds to the second polarizer 132.

On the other hand, an on-state refers to a state in which a voltage may be applied to the optical shutter 130. In the on-state, the liquid crystal molecules may be oriented along the direction of an electrical field such that the light beam transmitted through the first polarizer 131 is incident on the second polarizer 132 with no change in polarization direction. Thus, in an on-state, the light beam may be blocked by the second polarizer 132.

The optical shutter 130 may include a pixel region. Thus, the light beam may be transmitted through a pixel region to which a voltage is not applied, and/or the light beam may be blocked in a pixel region to which a voltage is applied. Thus, the optical shutter 130 may perform a control operation so that a light beam can be transmitted or blocked in a desired form by selectively applying a voltage to the optical shutter 130 on a pixel-by-pixel basis.

Figure 2A:
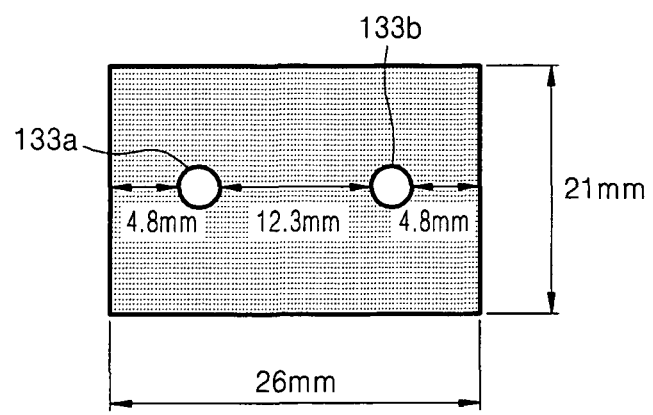
FIGS. 2A through 2E illustrate various patterns of an opening in an optical shutter according to an example embodiment.

For example, in FIG. 2A, the optical shutter 130 may be controlled so that there is a black backdrop and two openings 133a and 133b, represented by two white colored circles. The light beam may only pass through the two openings 133a and 133b. An applied voltage may control the two openings 133a and/or 133b. The openings 133a and/or 133b may be formed when no voltage is applied to the regions where said openings reside. In contrast, openings 133a and/or 133b do not form when a voltage is applied to the region where said openings reside, such that the light beam is blocked.

As mentioned above, by controlling whether a voltage is applied to each pixel, regions through which a light beam is to be transmitted (e.g., the openings 133a and/or 133b) may be freely selected in the optical shutter 130. In addition, by controlling whether a voltage is applied to each pixel, the positions of the openings 133a and/or 133b of the optical shutter 130 may be freely changed.

In this case, by controlling the number, size, location and/or interval of the openings 133a and/or 133b (that is, an interval between the openings 133a and/or 133b), a light beam incident on a photoresist (PR) 160 may be controlled so as to form a diffraction grating having various periods and/or directions. A method of controlling the period and/or direction of a diffraction grating is described below.

The focusing lens 140 may focus the two light beams transmitted through the optical shutter 130 (e.g., the openings 133a and/or 133b) so as to emit the two light beams to the photoresist 160 on a stage 150. The two light beams transmitted through the openings 133a and/or 133b may be focused on the same location of the photoresist 160. Thus, the two light beams focused by the focusing lens 140 may interfere with each other on the photoresist 160 to form interference patterns. The interference patterns may be recorded on the photoresist 160. Photoresist 160 is a photosensitive material. A diffraction grating may be manufactured on the photoresist 160, the interference patterns recorded on the photoresist 160 itself. The two light beams focused by the focusing lens 140 may be incident on the photoresist 160, and thus a diffraction grating having various periods and/or directions can be formed.

The light generating apparatus 100 may further include a controller 170. The controller 170 may control the optical shutter 130 on a pixel-by-pixel basis and/or may control movement of the stage 150.

Hereinafter, a method of controlling a period and/or direction of a diffraction grating will be described. FIGS. 2A through 2E illustrate various patterns of an opening in an optical shutter 130, according to example embodiments. FIGS. 3A through 3E illustrate patterns of diffraction gratings formed by light transmitted through the openings of FIGS. 2A through 2E, according to example embodiments.

A relationship between a period of a diffraction grating and/or an interval between the two openings displayed on the optical shutter 130 is given by Equation 1.

$$d=\lambda/(2n\cdot\sin\theta) \quad (1)$$

Here, "d" is a period of a diffraction grating, "λ" is a wavelength of light, and θ is an incident angle between two light beams.

According to Equation 1, when an incident angle between the two light beams is 90°, "d" is at a minimum since sin θ is at a maximum. On the other hand, the further θ is from 90° (that is, the closer θ is to 0° or 180°) the smaller sin θ, and the greater "d". Therefore, a diffraction grating having a desired period may be obtained by controlling an interval between the two the openings formed on the optical shutter 130.

Figure 2B:
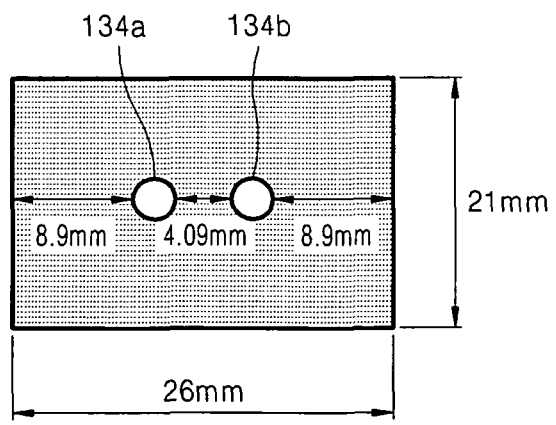
Figure 2C:
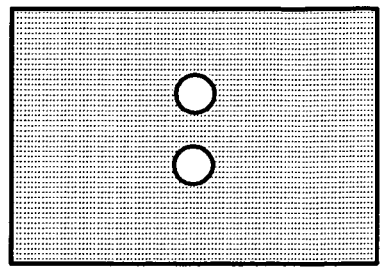
Figure 2D:
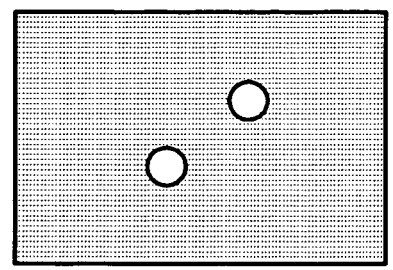
Figure 2E:
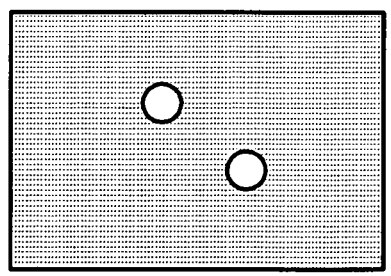

For example, referring to FIGS. 2A and 2B in which two openings are formed in the optical shutter 130, the interval between two openings 133a and 133b may be about 12.3 mm in a pattern (hereinafter, referred to as a 'pattern 1') of FIG. 2A, and an interval between two openings 134a and 134b may be about 4.09 mm in another pattern (hereinafter, referred to as a 'pattern 2') of FIG. 2B, which is narrower than the interval of FIG. 2A.

FIGS. 3A through 3E illustrate patterns of diffraction gratings may be formed by light transmitted through the openings of FIGS. 2A through 2E, respectively. Table 1 shows an incident angle and a period.

TABLE 1

|  | Pattern 1 | Pattern 2 |
| --- | --- | --- |
| Interval between openings | 12.3 mm | 4.09 mm |
| Size of opening | 30 μm | 30 μm |
| Incident angle | 3.52° | 1.17° |
| Fringe period | 4.3 μm | 13 μm |

Figure 3A:
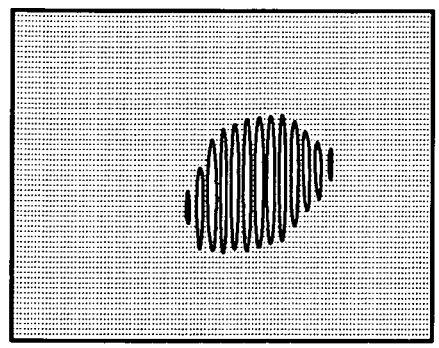
Figure 3B:
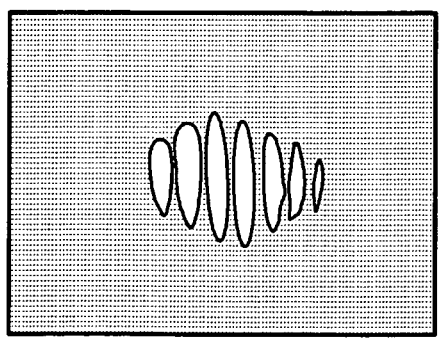

As illustrated in FIGS. 3A and 3B and Table 1, a period of the diffraction grating (see FIG. 3A) using the optical shutter 130 having a wide interval between openings may be smaller than a period of the diffraction grating (see FIG. 3B) using the optical shutter 130 having a narrow interval between openings. In other words, as an interval between openings decreases, an incident angle θ between two light beams may decrease. Thus, period "d" of the diffraction grating may increase.

As mentioned above, the direction of a diffraction grating may be controlled by rotating the locations of two openings displayed on the optical shutter 130. As the locations of two openings in the optical shutter 130 rotate as illustrated in FIGS. 2B through 2E, a grating angular orientation changes as illustrated in FIGS. 3B through 3E.

In addition, the spot size of a light beam transmitted through the optical shutter 130 may be controlled by changing the area of the opening displayed on the optical shutter 130. Furthermore, beam shaping of a light beam transmitted through the optical shutter 130 may be controlled by changing the shape of the opening in the optical shutter 130.

As mentioned above, in the light generating apparatus 100, a diffraction grating having various periods and/or directions may be manufactured by changing an interval between openings in the optical shutter 130, the locations of the openings, and/or the shapes of the openings.

In addition, since control of the openings of the optical shutter 130 can be performed by turning on/off pixels on a pixel-by-pixel basis, time and/or costs for manufacturing a diffraction grating may be reduced.

Light generating apparatus 100 may include a T-SLM as the optical shutter 130. As illustrated in FIG. 1 and discussed above, beam expander 120 collimates a light beam emitted from the light source 110. A parallel light beam transmitted through the beam expander 120 is incident on the optical shutter 130, and then is selectively transmitted by the optical shutter 130.

The optical shutter 130 may include a plurality of pixels. The plurality of pixels may be controlled to selectively transmit light on a pixel-by-pixel basis according to an on/off control. That is, a pixel region with no applied voltage permits transmission of a light beam, while a pixel region with an applied voltage blocks the light beam. Thus, the optical shutter 130 may operate so that a light beam can be transmitted or blocked according to a desired form by selectively applying a voltage to the optical shutter 130 on a pixel-by-pixel basis.

The light beam selectively transmitted through the optical shutter 130 is incident on the focusing lens 140. Likewise, the light beam focused by the focusing lens 140 is also incident on the photoresist 160 on the stage 150, thereby generating a diffraction grating having various periods and/or directions.

Figure 5:
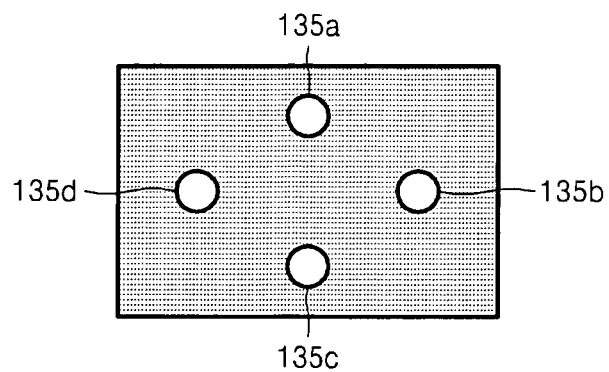
FIG. 5 illustrates openings displayed on an optical shutter illustrated in FIG. 4, according to an example embodiment.
Figure 6:
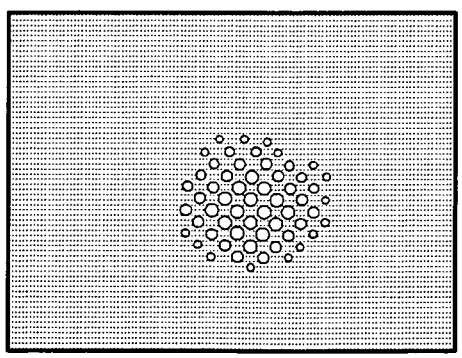
FIG. 6 illustrates a pattern of diffraction gratings formed by the light generating apparatus of FIG. 4 according to an example embodiment.

FIG. 4 illustrates a light generating apparatus 101 according to another example embodiment. FIG. 5 illustrates openings in an optical shutter 130 illustrated in FIG. 4, according to another example embodiment. FIG. 6 illustrates a pattern of diffraction gratings formed by the light generating apparatus 101 of FIG. 4, according to an example embodiment.

Referring to FIGS. 4 and 5, a plurality of openings 135a through 135d may be formed in the optical shutter 130 of the light generating apparatus 101. If a plurality of openings are formed in the optical shutter 130, and/or light beams are selectively transmitted, a multi diffraction grating may be formed, as illustrated in FIG. 6. By forming a plurality of openings, a multi beam may be easily formed, and thus an interference pattern can be formed on the photoresist 160. In addition, using the interference pattern, two-dimensional and/or three-dimensional photonic crystal type patterns, which to date are not easily manufactured, may be manufactured.

Figure 7:
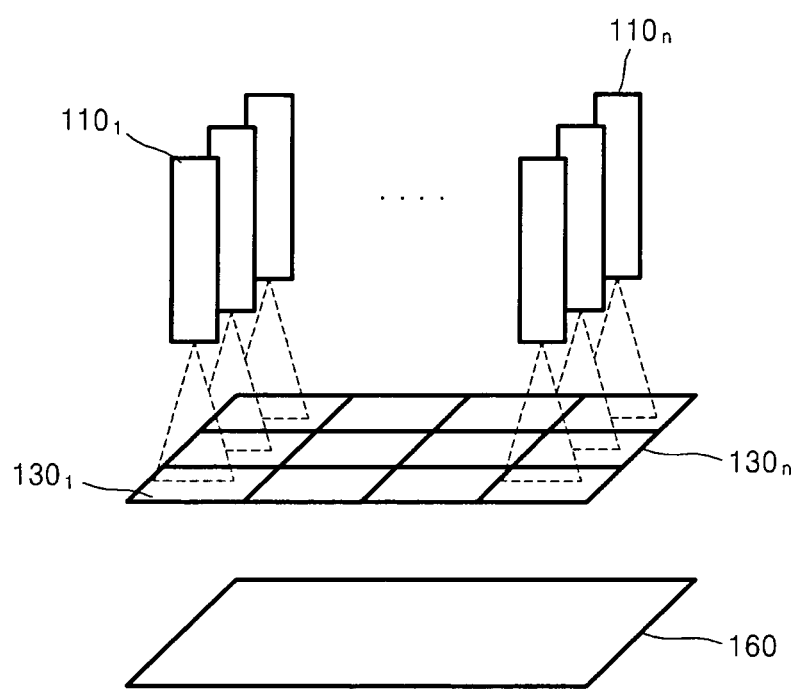
FIG. 7 illustrates a light generating apparatus including a plurality of light sources and a plurality of optical shutters according to an example embodiment.

As illustrated in FIG. 7, when a plurality of light sources $110_1$ through $110_n$ and/or a plurality of optical shutters $130_1$ through $130_n$ are arranged in an array type, a large-sized pattern may be embodied. Furthermore, when the light sources $110_1$ through $110_n$ and/or the optical shutters $130_1$ through $130_n$ are arranged in the array type, a nano pattern partially having various shapes may be manufactured.

Figure 8:
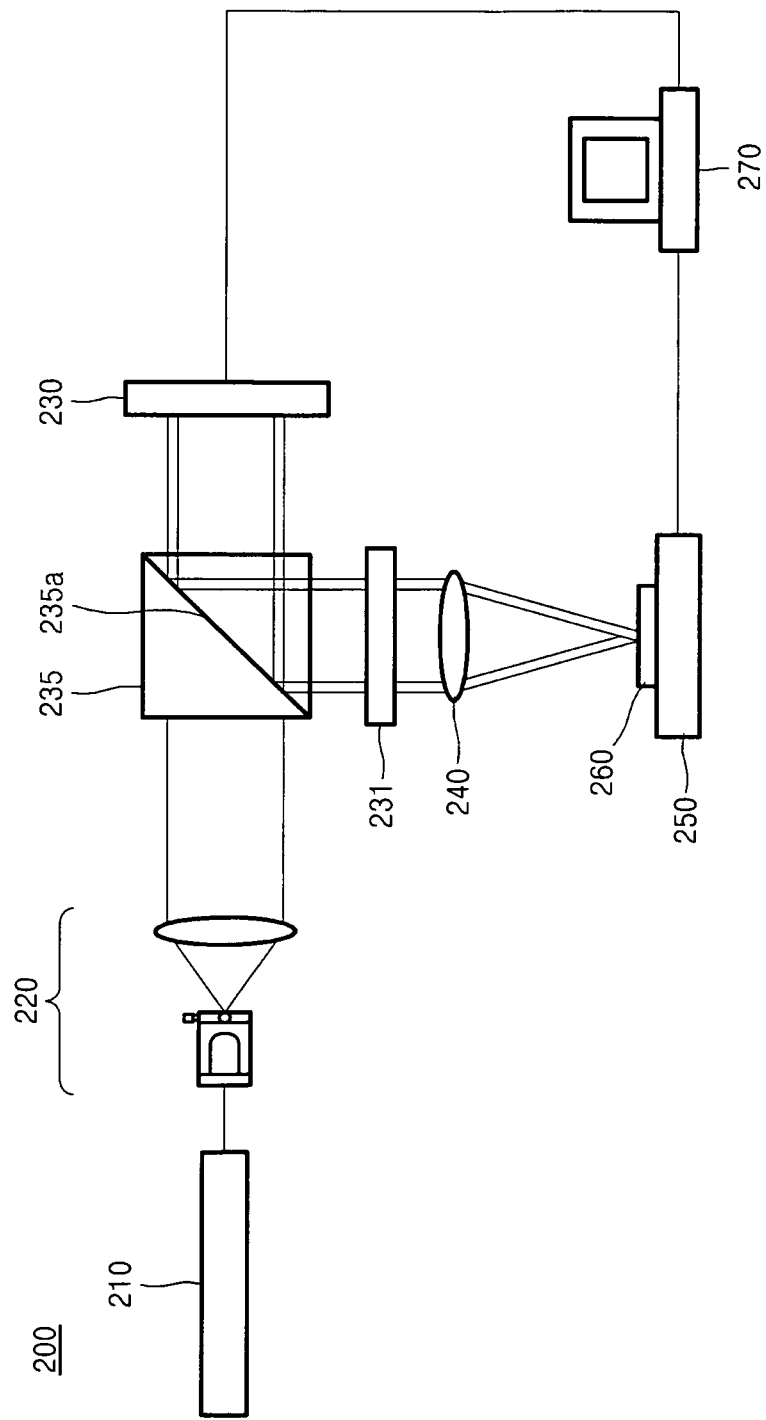
FIG. 8 illustrates a light generating apparatus according to an example embodiment.

FIG. 8 illustrates a light generating apparatus 200 according to another example embodiment.

Referring to FIG. 8, the light generating apparatus 200 may include a light source 210, a beam expander 220, a beam splitter 235, an optical shutter 230, a polarizer 231 and/or a focusing lens 240. The light generating apparatus 200 may be different from the light generating apparatus 100 of FIG. 1. For example, the light generating apparatus 200 may further include the beam splitter 235, and/or the optical shutter 230 may be liquid crystal on silicon (LCoS), which may be a reflective spatial light modulator (R-SLM).

The optical shutter 230 may include a plurality of pixels, and can selectively transmit light by turning on/off pixels on a pixel-by-pixel basis.

Hereinafter, operating processes of the light generating apparatus 200 including an R-SLM as the optical shutter 230 will be described.

First, a light beam emitted from the light source 210 may be collimated by the beam expander 220. A parallel light beam transmitted through the beam expander 220 may be incident on the beam splitter 235. The beam splitter 235 may divide the incident light and/or may provide the incident light beam to the optical shutter 230. In addition, the beam splitter 235 may provide a light beam reflected by the optical shutter 230 to the focusing lens 240. To achieve this, the beam splitter 235 may have surfaces facing the beam expander 220, the optical shutter 230, and/or the focusing lens 240, respectively.

For example, a general beam splitter, which divides the intensity of incident light in half by transmitting some of the light beams and/or reflecting the remaining light beams, may be used as the beam splitter 235. The light beam transmitted through the beam splitter 235 may be incident on the optical shutter 230.

In the present embodiment, since an R-SLM may be used as the optical shutter 230, when a light beam is incident on the optical shutter 230 and/or the optical shutter 230 is in an off-state (no voltage applied), the optical shutter 230 may rotate by 90 degrees and reflect the light beam. On the other hand, in an on-state (voltage applied), the light beam incident on the optical shutter 230, which is polarized light, may be reflected with no change. The light beam reflected by the optical shutter 230 may be incident on the beam splitter 235. The light beam incident on the beam splitter 235 may be reflected by a coated surface 235a of the beam splitter 235. Then, a first part of the light beam reflected by the coated surface 235a, which is reflected with no change, may be absorbed by the polarizer 231. A second part of the light beam reflected by the coated surface 235a, which is rotated by 90 degrees, may be transmitted through the polarizer 231 to be incident on the focusing lens 240. Then, a light beam focused by the focusing lens 240 may be incident on a photoresist 260 on a stage 250. At this time, using an interference pattern formed on the photoresist 260, a diffraction grating having various periods and/or directions may be formed.

Figure 9:
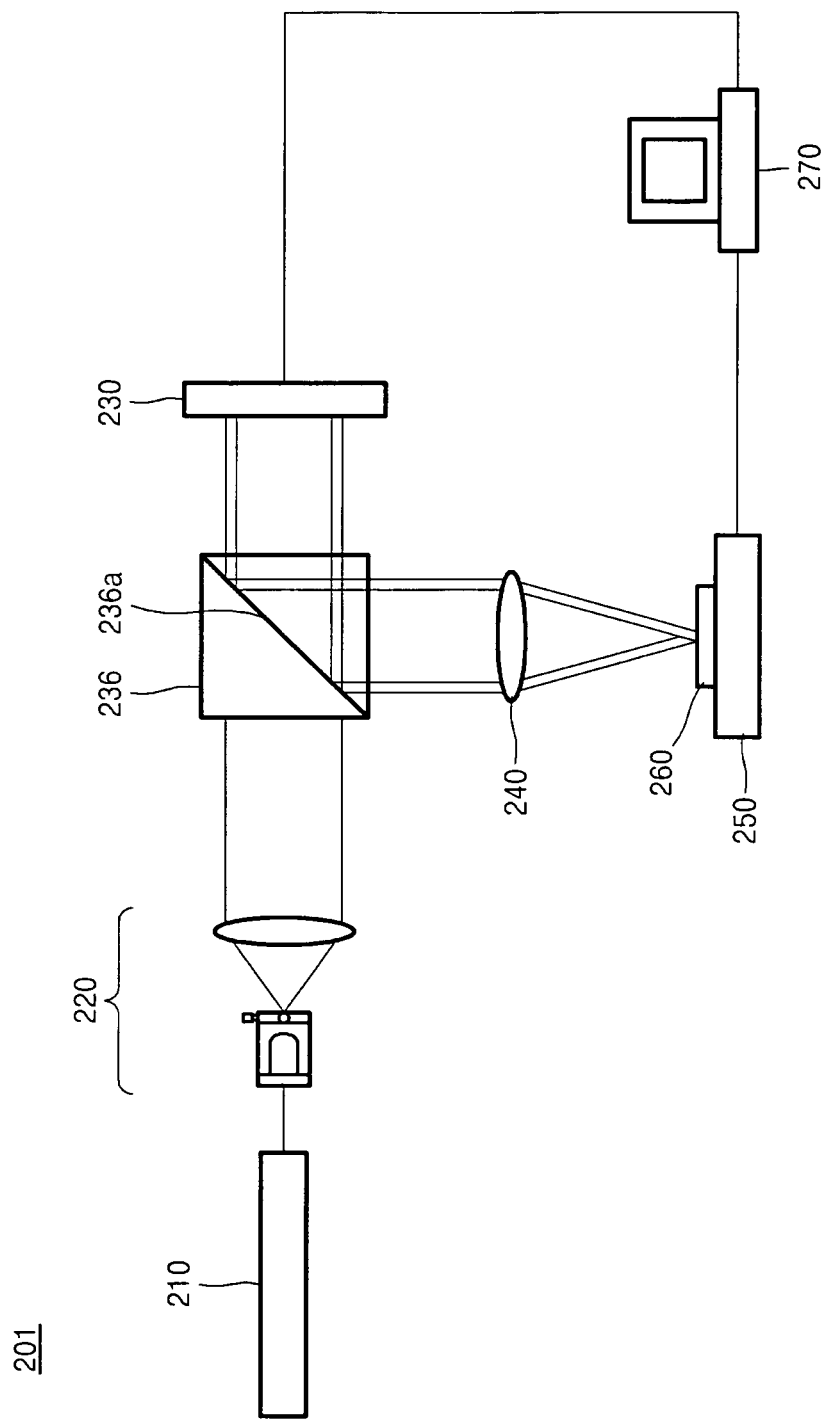
FIG. 9 illustrates a light generating apparatus according to an example embodiment.

FIG. 9 illustrates a light generating apparatus 201 according to another example embodiment.

Referring to FIG. 9, the light generating apparatus 201 may include a light source 210, a beam expander 220, a polarization beam splitter 236, an optical shutter 230 and/or a focusing lens 240.

The light generating apparatus 201 may be different from the light generating apparatus 200 of FIG. 8 in that the light generating apparatus 201 may further include the polarization beam splitter 236. The optical shutter 230 may be a liquid crystal type modulator such as an LCoS, which is an R-SLM.

Hereinafter, operating processes of the light generating apparatus 201 including an R-SLM as the optical shutter 230 and the polarization beam splitter 236 are described.

First, a light beam emitted from the light source 210 is collimated by the beam expander 220. A parallel light beam transmitted through the beam expander 220 is divided by the polarization beam splitter 236.

In particular, the polarization beam splitter 236 may be a beam splitter reflecting an S-polarized light beam and/or transmitting a P-polarized light beam. In this case, a light beam emitted from the light source 210 may be a P-polarized light beam so as to proceed towards the optical shutter 230. A light beam transmitted through the polarization beam splitter 236 may be incident on the optical shutter 230.

In the present embodiment, since the optical shutter 230 may be an R-SLM like the case of FIG. 8, a light beam incident on the optical shutter 230 may rotate by 90 degrees and/or may be reflected (S-polarization) in an off-state in which a voltage is not applied. On the other hand, in an on-state in which a voltage is applied, the light beam incident on the optical shutter 230, which is polarized light (P-polarization), may be reflected with no change. The light beam reflected by the optical shutter 230 may be incident back on the polarization beam splitter 236. Only a light beam, which is an S-polarized light beam, is reflected by a coated surface 236a to be incident on the focusing lens 240. Also, when (i) a quarter wave plate (not shown) is disposed between the polarization beam splitter 236 and the optical shutter 230, and (ii) the optical shutter 230 provides optical signals opposite to the optical signals illustrated in FIG. 8, the same effect as the case of FIG. 8 can nevertheless be obtained. That is, in FIG. 9, a light beam rotated by the optical shutter 230 by 90 degrees may be transmitted through the polarization beam splitter 236, and/or only a an unchanged light beam, reflected by the optical shutter 230, may be reflected by the polarization beam splitter 236 to be incident on the focusing lens 240.

A light beam focused by the focusing lens 240 may be incident on the photoresist 260 on a stage 250, and thus a diffraction grating having various periods and/or directions can be formed.

Figure 10:
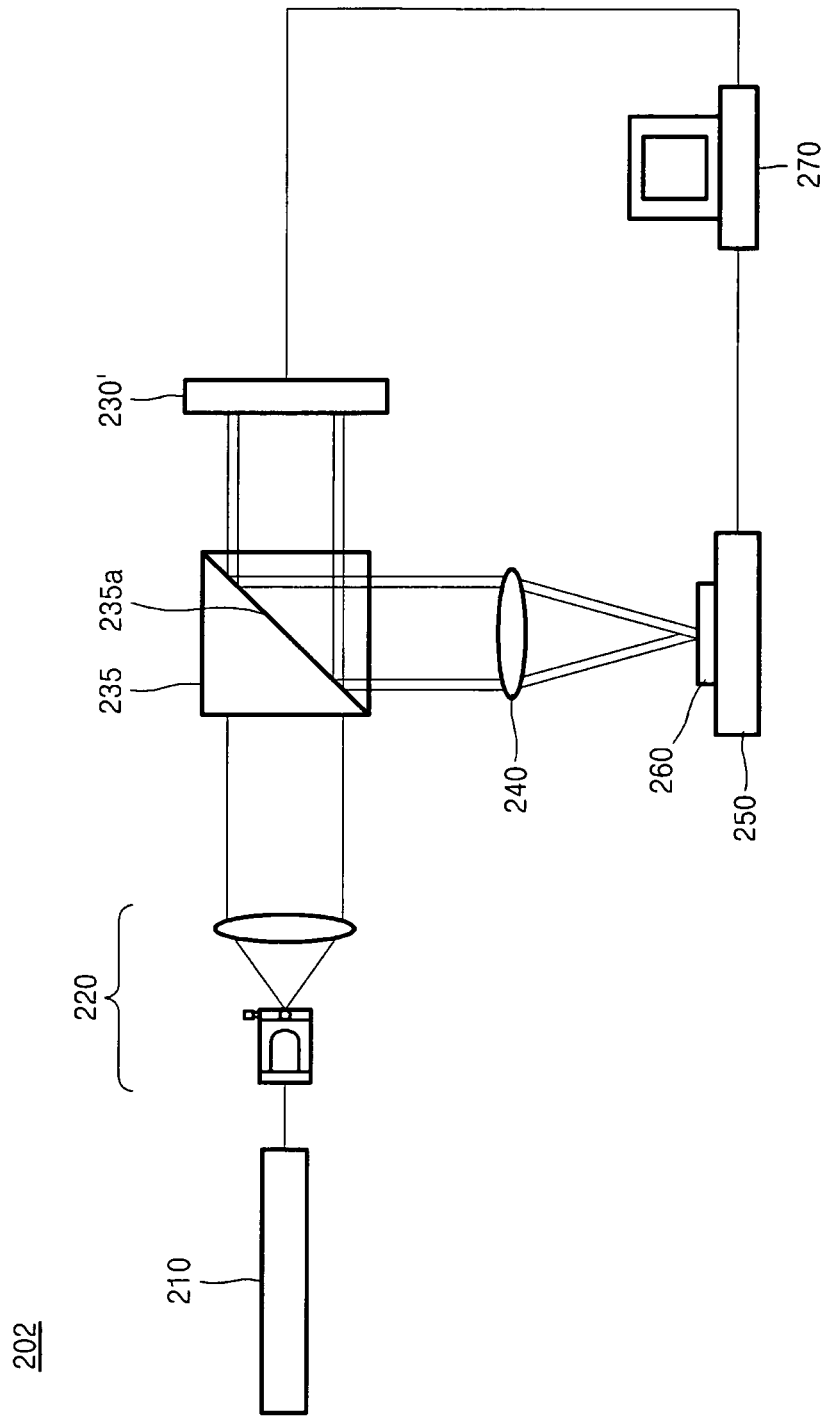
FIG. 10 illustrates a light generating apparatus according to an example embodiment.

FIG. 10 illustrates a light generating apparatus 202 according to another example embodiment. In FIG. 10, the light generating apparatus 202 may include a light source 210, a beam expander 220, a beam splitter 235, an optical shutter 230' and/or a focusing lens 240. The light generating apparatus 202 may be different from the light generating apparatus 201 of FIG. 9 in that the optical shutter 230' may be a MEMS type modulator such as a digital micro-device (DMD), which is an R-SLM.

Operating processes of the light generating apparatus 202 may include an R-SLM as the optical shutter 230'. First, a light beam emitted from the light source 210 may be collimated by the beam expander 220. A parallel light beam transmitted through the beam expander 220 may be divided by the beam splitter 235 and then emitted to the optical shutter 230.

In the present example embodiment, since the optical shutter 230' is an MEMS type modulator, desired pixel regions may reflect light beams towards the beam splitter 235, and the other non-desired pixel regions may not reflect light beams towards the beam splitter 235. A light beam incident on the beam splitter 235 may be reflected by a coated surface 235a to be incident on the focusing lens 240. When a polarization beam splitter and/or a quarter wave plate are used instead of the beam splitter 235, the same effect illustrated in FIG. 10 may be obtained. Otherwise, the light beams not reflected toward the beam splitter 235 may not be incident on the focusing lens 240.

A light beam focused by the focusing lens 240 may be incident on a photoresist 260 on a stage 250, and thus a diffraction grating having various periods and/or directions can be formed.

Like in the case of FIG. 1, in FIGS. 8 through 10, a diffraction grating having various periods and/or directions may be manufactured by changing an interval between openings displayed on the optical shutters 230 and 230'. In addition, since control of the openings of the optical shutter 230 may be performed by turning on/off pixels on a pixel-by-pixel basis, time and/or costs for manufacturing a diffraction grating may be reduced.

As described above in the description of the example embodiments, the optical shutter may be controlled by electrical driving method rather than a mechanical driving method. In addition, various nano patterns may be easily formed by adjusting a portion of the optical shutter. For example, the optical shutter may be adjusted to permit openings through which a light beam is transmitted, the locations of the openings, and/or the shapes of the openings. Thus, since time and/or costs for manufacturing a diffraction grating may be reduced, the industrial effective value of the diffraction grating may be improved.

The described example embodiments are descriptive only and are not non-limiting. Descriptions of features or aspects within each example embodiment should typically be considered as available for other similar features or aspects in other embodiments.

What is claimed is:
1. A light generating apparatus comprising:
a light source emitting a light beam;
a beam expander that enlarges and collimates the light beam;

an optical shutter configured to selectively transmit a light beam coming from the beam expander to form at least two non-diffracted light beams; and a focusing lens focusing the at least two light beams on a same location such that the at least two light beams interfere with each other to form a diffraction grating pattern on the location, and wherein the optical shutter includes a plurality of pixels such that the optical shutter selectively transmits a light beam according to an on/off control, wherein the on/off control operates on a pixel-by-pixel basis and is configured to form at least two optical openings in the optical shutter such that the light beam coming from the beam expander is selectively transmitted through the openings, the at least two openings being separated by at least one pixel from each other, and wherein the on/off control adjusts at least one of
 an interval between the at least two openings,
 sizes of at least one of the at least two openings,
 locations of at least one of the at least two openings, and
 shapes of at least one of the at least two openings, wherein a period and a direction of the diffraction grating pattern are controlled according to only the on/off control of the optical shutter.

2. The light generating apparatus of claim 1, wherein a first portion of the optical shutter transmits the light beam transmitted through the beam expander, and a second portion of optical shutter does not transmit the light beam transmitted through the beam expander.

3. The light generating apparatus of claim 1, wherein the focusing lens focuses the at least two light beams transmitted through the focusing lens on a photosensitive layer, and forms the diffraction grating pattern using an interference pattern formed on the photosensitive layer by interference of the focused at least two light beams.

4. The light generating apparatus of claim 1, wherein the optical shutter further includes a spatial light modulator.

5. The light generating apparatus of claim 1, wherein the beam expander further includes a collimating lens changing the light beam emitted from the light source into a parallel light beam.

6. The light generating apparatus of claim 1, wherein the light generating apparatus further includes a plurality of light sources and a plurality of optical shutters, the plurality of light sources and the plurality of optical shutters arranged in an array shape.

7. The light generating apparatus of claim 1 further comprising:
 a beam splitter having surfaces facing the beam expander, the optical shutter and the focusing lens, providing the light beam coming from the beam expander to the optical shutter, and providing the at least two light beams emitted from the optical shutter to the focusing lens.

8. The light generating apparatus 7, further comprising:
 a polarizer polarizing the at least two light beams provided by the beam splitter, the polarizer being between the beam splitter and the focusing lens.

9. The light generating apparatus 7, wherein the beam splitter further includes a polarization beam splitter.

10. The light generating apparatus 7, wherein the optical shutter further includes at least one of a liquid crystal on silicon (LCoS) and a digital micro mirror device (DMD).

11. A light generating apparatus for manufacturing a nano diffraction grating pattern comprising:
 an apparatus configured to selectively provide a light beam and including an on/off control;
 an optical shutter including a plurality of pixels, the on/off control configured to control the optical shutter on a pixel-by-pixel basis, wherein the optical shutter is configured to at least one of selectively transmit and selectively reflect the light beam to form at least two non-diffracted light beams separated by at least one pixel from each other on the optical shutter; and
 a stage configured to mount a photosensitive layer thereon, the photosensitive layer configured to receive the at least two light beams such that the at least two light beams interfere with each other to form the nano diffraction grating pattern on the photosensitive layer,
 wherein a period and a direction of the nano diffraction grating pattern are controlled according to only the on/off control of the optical shutter.

12. A method of controlling a light generating apparatus, the method comprising:
 emitting a light beam from a light source;
 enlarging the light beam emitted from the light source;
 collimating the light beam emitted from the light source;
 selectively transmitting a collimated light beam to form at least two non-diffracted light beams; and
 focusing the at least two light beams on a same location such that the at least two light beams interfere with each other to form a diffraction grating pattern on the location, and
 wherein the selectively transmitting is performed on a pixel-by-pixel basis by an on/off control, the on/off control controlling an optical shutter including a plurality of pixels,
 wherein the selectively transmitting is performed by controlling the optical shutter, on which at least two openings separated by at least one pixel from each other are to be formed, so that only a light beam incident on the openings is transmitted through the optical shutter, and
 wherein the on/off control adjusts at least one of
  an interval between the at least two openings,
  sizes of at least one of the at least two openings,
  locations of at least one of the at least two openings, and
  shapes of at least one of the at least two openings,
 wherein a period and a direction of the diffraction grating pattern are controlled according to only the on/off control of the optical shutter.

13. The method of claim 12, wherein the selectively transmitting further comprises:
 dividing the light beam by a beam splitter; and
 selectively reflecting a divided light beam by an optical shutter.

* * * * *